United States Patent [19]

Dumont et al.

[11] Patent Number: 5,032,468
[45] Date of Patent: Jul. 16, 1991

[54] COMPOSITE ALUMINUM PLATE AND TARGET FOR PHYSICAL COATING PROCESSES PRODUCED THEREFROM AND METHODS FOR PRODUCING SAME

[75] Inventors: Christian M. Dumont, Bornheim; Norbert W. Schmitz, Euskirchen; Hans Quaderer, Schaan, all of Fed. Rep. of Germany

[73] Assignee: Vereinigte Aluminium Werke, Bonn, Fed. Rep. of Germany

[21] Appl. No.: 441,866

[22] Filed: Nov. 27, 1989

[30] Foreign Application Priority Data

Nov. 25, 1988 [DE] Fed. Rep. of Germany ....... 3839775

[51] Int. Cl.$^5$ ...................... B32B 15/00; C23C 14/00; C22C 21/00
[52] U.S. Cl. .................... 428/636; 148/415; 204/298.13; 428/650; 428/654
[58] Field of Search ................ 428/636, 650, 654; 427/123; 204/298.02, 298.04, 298.13

[56] References Cited
U.S. PATENT DOCUMENTS 2,383,511  8/1945  Reynolds ........................ 428/654

FOREIGN PATENT DOCUMENTS 59-179784 10/1984 Japan .................. 204/298.12
63-270460 11/1988 Japan .................. 204/298.12
1-96375   4/1989 Japan .................. 204/298.12

Primary Examiner—R. Dean
Assistant Examiner—Robert R. Koehler
Attorney, Agent, or Firm—Darby & Darby

[57] ABSTRACT

The present invention provides a composite aluminum plate suitable as a target for coating purposes, said plate comprising a surface layer melted on the basis of pure aluminum (Al≧99.99), optionally consisting of a pure alloy, e.g., the members of which have a purity greater than or equal to 99.99%, melted on the basis of pure aluminum (Al≧99.99); and (2) a supporting layer comprising a hardenable aluminum alloy having a Brinell hardness index HB of at least about 50 after being heat-treated under suitable conditions. This invention further provides a target suitable for physical or sputter coating processes, such as cathodic sputtering and magnetron sputtering. Methods for preparing such a plate and target are also provided.

5 Claims, 3 Drawing Sheets

SUPPORTING LAYER 2

SURFACE LAYER 1

20X MAGNIFICATION 1000 um

COMPOSITE ALUMINUM PLATE AND TARGET FOR PHYSICAL COATING PROCESSES PRODUCED THEREFROM AND METHODS FOR PRODUCING SAME

FIELD OF THE INVENTION

This invention relates to a composite aluminum plate, a target suitable for physical coating processes produced from such a plate, and to methods of producing such plate and target.

BACKGROUND OF THE INVENTION

Several processes have been used for physically coating metal surfaces, including aluminum and aluminum alloy surfaces. One method known as cathodic sputtering involves "atomizing" or "bombarding" a suitable target with high energy gas ions, which are accelerated in an electric field. Using cathodic sputtering, the surface atoms are displaced from the target and deposited on the surface to be coated where they form a layer.

In a modification of the cathodic sputtering method, a magnetic field is applied to the target to increase the sputtering rate significantly, according to the Penning principle. This modified cathodic sputtering technique is referred to as magnetron sputtering. In magnetron sputtering, a small proportion of the energy which is applied to the target is converted into kinetic energy with the majority of energy transformed into heat. To effectively displace atoms from the surface of the target, the heat must be dissipated by intensively cooling the target.

One serious consequence of bombardment heating, arising from, for example, magnetron sputtering, is a marked deterioration in the mechanical stability, including the shape, of the aluminum and aluminum alloy metal target.

To overcome this deterioration in metal stability, and to allow for sputtering with high energy output, prior art teachings have provided composite targets with backing plates, which impart high mechanical stability and good heat conductivity, to improve the physical characteristics of the composite target and its performance during bombardment heating. Such backing plates minimize the heating of the target and its consequent deformation.

Backing plates taught by the prior art for aluminum and aluminum alloy targets typically consist of copper. The two metals, i.e., aluminum and copper, or aluminum alloy and copper, are normally joined by conventional methods such as gluing, soldering or explosive plating. In such target forms, the technique of roll-bonding the metals is not feasible because the thickness of the copper layer in the backing plate cannot be more than 3 mm. Such thicknesses, i.e., thinner than 3 mm, limit the degree of mechanical stability and resistance to heat deformation which can be imparted to the aluminum or aluminum alloy layer by the copper backing. Thus, such prior art targets which employ copper backings are seriously disadvantaged.

OBJECTS OF THE INVENTION

It is an object of the present invention to provide a two-layered composite aluminum plate comprising an aluminum or aluminum alloy surface layer and a supporting layer of hardenable aluminum alloy, which will harden under suitable conditions and is useful to make a target suitable for physical coating processes.

It is a further object of this invention to provide a composite aluminum plate whereby the two layers, surface and supporting layers, can be joined by roll-bonding even though the supporting layer or backing layer has a thickness exceeding 3 mm.

It is yet a further object of this invention to provide a composite aluminum plate in which a supporting layer is hardenable under suitable heating and precipitating conditions to a Brinell hardness index of at least about 50, and even 70 or higher.

It is another object of this invention to provide a heat conductive target that is mechanically stable to bombardment heating arising from physical or sputter coating processes, such as cathodic or magnetron sputtering.

It is another object of this invention to provide methods for preparing roll-bondable composite aluminum plates and targets suitable for physical or sputter coating processes produced therefrom with the advantages and features described herein.

These and other objects of the present invention will be apparent to those of ordinary skill in the art in light of the present specification and appended claims.

SUMMARY OF THE INVENTION

It has now been discovered that a composite aluminum plate useful to produce a target for physical coating processes can be prepared in which the layers contained therein can be joined together by roll-bonding. The plate comprises a surface layer melted on the basis of pure aluminum base, i.e., pure aluminum (Al $\geq$ 99.99), optionally with a pure alloy member melted on a pure aluminum (Al $\geq$ 99.99) basis; and a supporting layer comprising a hardenable aluminum alloy having a Brinell hardness index (HB) of at least about 50 under suitable heat treatment and curing conditions. Pure binary alloys, e.g., AlCu, AlCr, AlSi and AlTi with total impurities <0.01%, and pure tertiary alloys, e.g., AlSiCu and AlSiTi, with total impurities <0.01% may be employed as the optional alloy members.

It has also been discovered that a target suitable for physical or sputter coating processes, such as cathodic sputtering and magnetron sputtering, can be produced by rollbonding the construction described in this specification at a temperature between about 350° C. and 480° C. The proportion of supporting material preferably constitutes 20–35% of the total thickness. After roll-bonding with a rolling ratio of at least about 20%, the roll-bonded composite aluminum plate is heated in a conventional salt bath at a temperature in the range of from about 450° C. to about 550° C. for less than about 30 minutes, preferably less than 15 minutes. The composite aluminum plate is then quenched (cooled suddenly) in water and subsequently subjected to an artificial aging treatment of 2 to 16 hours at 160° to 180° C. Under these conditions, the supporting layer is hardened so as to enable the target to withstand the bombardment heating attendant when such physical or sputter coating processes are applied to the target.

DETAILED DESCRIPTION OF THE INVENTION

All literature references and patents cited in this specification are hereby incorporated by reference in their entirety.

Figure 1:
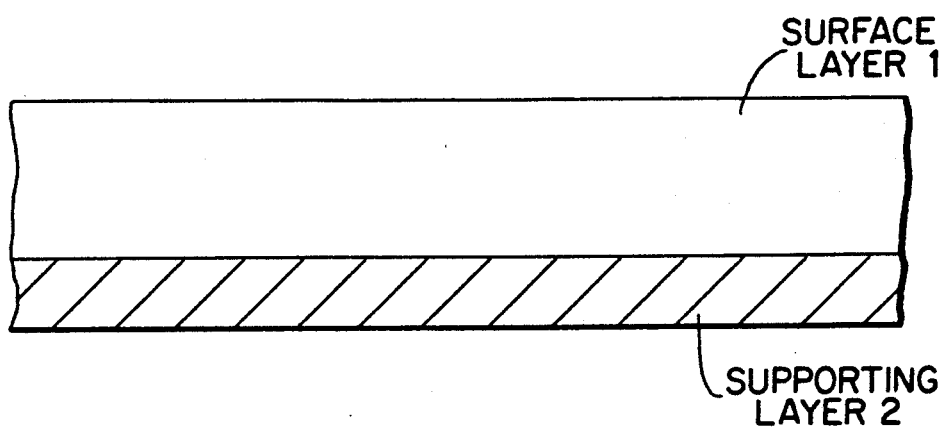
FIG. 1 is an illustration which shows a cross-section through the composite aluminum plate of the present invention.
Figure 2:
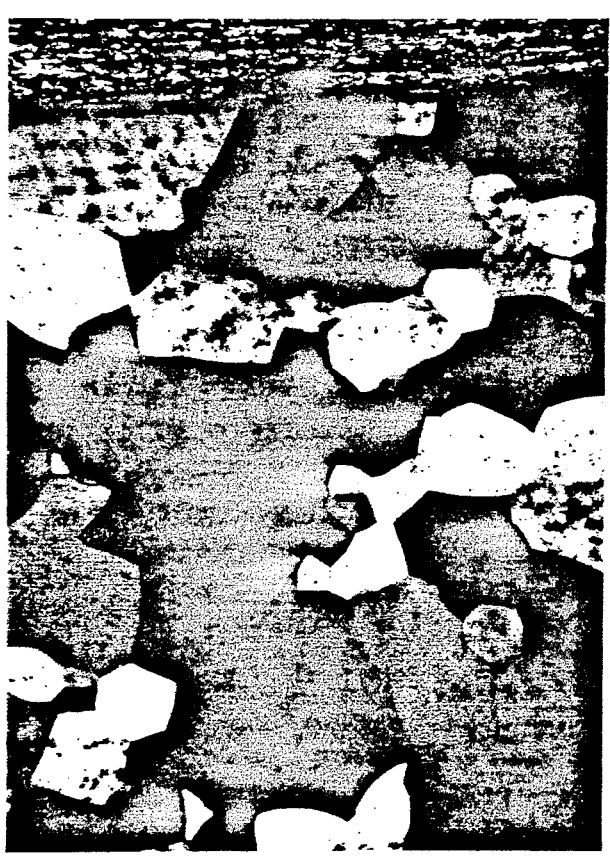
FIGS. 2 and 3 are photographs at 20× magnification of a transverse ground section of the hardened composite aluminum plate produced in accordance with the present invention (see Examples and Table 2).
Figure 3:
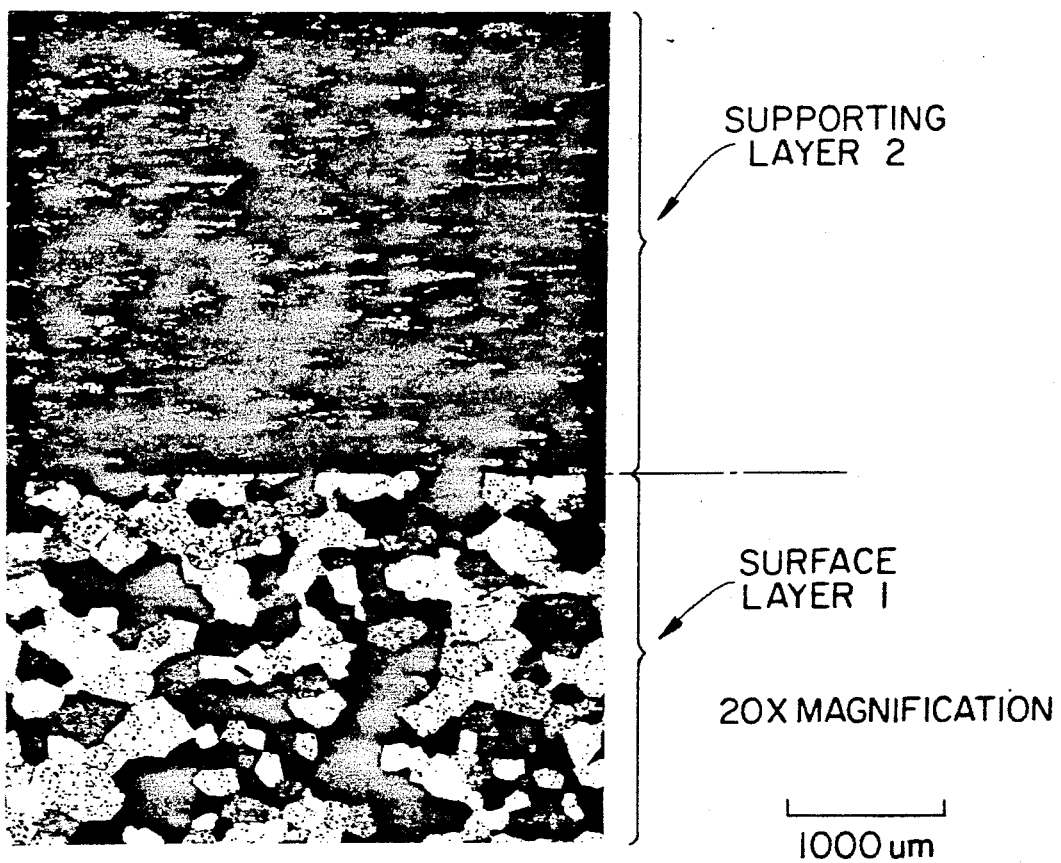

The present invention provides a composite aluminum plate useful to produce a target for coating processes. The composite plate comprises a surface layer (1) melted on pure aluminum basis, i.e., of pure aluminum (Al≧99.99), optionally with a pure alloy member melted on a pure aluminum (Al≧99.99) basis; and a supporting layer (2) comprising a hardenable aluminum alloy having a Brinell hardness index (HB) of at least about 50 under suitable heat treatment and curing conditions. The surface layer (1) and the supporting layer (2) are shown in FIGS. 1-3. Suitable conditions for obtaining the desired Brinell hardness, i.e., hardening conditions, include the following: solution treatment in a salt bath at temperatures between about 450° C. and 550° C., preferably between about 470° C. and 500° C. for less than about 30 minutes, preferably less than about 15 minutes and more preferably for between about 3 to 10 minutes; then water quenching followed by aging or curing for between about 2 and 16 hours at a temperature between about 160° to 180° C.

As used herein, the "pure" aluminum contained in the surface layer (1) melted on pure aluminum basis comprises aluminum having a purity of about 99.99 percent or greater (impurities≦0.01 percent). Where an aluminum alloy is contemplated, the aluminum alloy layer is melted on a pure aluminum basis (Al≧99.99). A pure binary alloy, e.g., AlCu, AlCr, AlSi and AlTi, with total impurities<0.01%, or a pure ternary alloy, e.g., AlSiCu or AlSiTi, with total impurities<0.01% can be melted on a pure aluminum (Al≧99.99) basis. As such pure binary alloys, at least one member selected from the group consisting of silicon, copper, titanium and chromium, or any combination of the foregoing, may be so employed. Preferred as a pure alloy member in the surface layer (1) is silicon. In a preferred embodiment of this invention, as described in the examples which follow, the surface layer of aluminum comprises a pure silicon binary alloy melted on a pure aluminum (Al≧99.99) base. For the alloy members, the highest amount contemplated for Si and Ti is about 2%, and for Cu and Cr, about 4%, of the total surface layer (1) composition.

Therefore, when an aluminum alloy is contemplated in the surface layer (1), i.e., as a pure alloy melted on a pure aluminum basis, a binary aluminum alloy, such as AlCu, AlCr, AlSi and AlTi, or a ternary alloy, such as AlSiCu and AlSiTi may be so employed. In such embodiments, the pure binary or ternary alloy is melted on a pure aluminum (Al≧99.99) basis. In the case of either the pure binary alloy or the pure ternary alloy, as stated above, the impurities are lower than or equal to 0.01 percent.

The supporting layer (2) of the composite aluminum plate comprises a hardenable aluminum alloy having at least one member selected from the group consisting of AlMgSi, AlMgSiCu and AlCuMg. Preferred as the aluminum alloy member in the supporting layer (2) is AlMgSi.

Roll-bonding of the layers (1) and (2) and the desired characteristics in the final target product, such as heat conductivity and mechanical stability is particularly enhanced when the aluminum or aluminum alloy layer in the surface layer (1) has a thickness of from about 5 mm to about 30 mm. preferably from about 8 mm to about 20 mm, and when the supporting layer (2) has a thickness of from about 1 mm to about 15 mm, preferably from about 2 mm to about 10 mm. Additionally, roll-bonding and the characteristics sought in the composite aluminum plate and target are enhanced when the supporting layer (2) comprises from about 10 to about 40%, preferably from about 20 to about 35%, of the total thickness of the composite aluminum plate.

The aluminum surface (1) layer and the supporting layer (2) can be roll-bonded by conventional means, using the following technique. The surface of the parts or layers to be (roll) bonded have to be decreased, brushed, joined, heated in temperature range of between about 380° C. and 480° C., preferably between about 380° C. and 450° C., more pref 410° C. and 430° C., and rolled down on a conventional hot rolling mill. Roll-bonding is carried out by performing many roll passes with increasing thickness reduction using a conventional Achenbach rolling mill (Achenbach, Buschhuetten, West Germany). During the roll-bonding operation the aluminum surface layer (1) is heated to a temperature in the range of from about 350° C. to about 480° C., preferably from about 380° C. to about 450° C., more preferably from about 410° C. to about 430° C. The reduction ratio is determined conventionally, for example, from the following formula:

$$\text{Reduction Ratio} = \frac{D_0 - D_1}{D_0} \times 100\%$$

where $D_0$=entrance thickness and $D_1$=exit thickness.

As discussed in the Background section of this specification, the surface layer (1) is bombarded with high energy gas ions during a sputtering treatment. In order to achieve a uniform removal of surface atoms and by consequence, extend the service life of the surface layer (1) as long as possible, the surface layer (1) must be formed as uniformly and homogeneously as possible, as described herein. For example, if the thickness of the supporting layer (2) is from about 20 to about 35% of the total thickness of the composite aluminum plate, such uniformity and homogeneity can best be achieved when the composite plate is roll-bonded by a degree of rolling of at least about 20% at temperatures ranging from 350° to about 480° C.

When roll-bonded in accordance with the present invention, the roll-bonded composite aluminum plate can next be solution heat treated, i.e., treated by contacting, immersing, soaking, placing, etc., in a salt bath or an air furnace. Contacting, immersing, soaking, placing, etc., of the plate is carried out at a temperature of from about 450° C. to about 550° C., preferably from about 470° C. to about 500° C. for a period of time sufficient to achieve the desired annealing of the supporting layer (2). In general, an immersion period of less than about 30 minutes is useful in the practice of this invention. The time required for annealing time is preferably between about 3 and about 30 minutes, i.e., the plate is immersed or soaked for between about 3 and about 30 minutes. The preferred range of annealing time is between about 5 and about 20 minutes.

Heating the roll-bonded composite aluminum plate in a salt bath at a temperature between about 450° C. and about 550° C. for less than about 30 minutes is critical to achieving desirable grain characteristics in the surface layer (1). A globulitic fine grain with an elongation ratio of less than 2 is particularly desirable. Desirable grain characteristics are obtained after heating the roll-bonded composite aluminum plate in a salt bath in accordance with the present invention. The average grain diameter, as measured by the method of Dederichs and Kostron, was less than 1 mm. The times specified for heating in the salt bath are also critical. If the treatment time (i.e., the immersion time in the salt bath) exceeds 30 minutes, a coarse grain is obtained, which leads to irregularities in the sputtering rate during removal of surface atoms from the surface layer (1). Such irregularities are not desirable because they lead to a non-uniform deposition on the substrate.

Conversely, if the treatment time (heating in a salt bath) is less than about 1 minute, the proportion of the cured (artificially aged) aluminum-containing phases which goes into solution, is too low, resulting in a material that has a poor Brinell hardness index (HB). For example, a Brinell hardness index (HB) of 50 will not be reached after curing or artificial aging of the target, resulting in poor mechanical stability under load when employed in coating processes, such as cathodic sputtering.

It has been found that when these treatment conditions are carried out for a sufficient period of time under such heating temperatures, including subsequent quenching and curing, the conditions are suitable and useful to anneal or harden the supporting layer (2) to a Brinell hardness index (HB) of at least about 50, preferably of at least about 70, more preferably to at least about 84. Brinell hardness is an industry standard of hardness as measured conveniently, for example, by DIN 50351 with load of 613N and ball theta of 2.5 mm. As exemplified in the examples which follow, even higher HB hardness indices of from about 95 to about 115 have been achieved under suitable heating and curing conditions, e.g., from about 5 to about 20 minutes at a temperature from about 490° C. to about 53020 C.

Desirable characteristics in the surface layer (1), such as grain cross-section (measured in square micrometers), average grain diameter (measured in micrometers), and elongation ratio have been obtained as shown by the following examples. It has been found for example, an average grain diameter of about 4 mm or less is produced in the aluminum (or aluminum alloy) surface layer (1) of a target prepared according to this invention. Preferred is an average grain diameter of about 2 mm or less. In addition, an elongation ratio of less than about 2, preferably 1, can be obtained in the aluminum um to about 151-309 um; and an elongation ratio of 1. In such embodiments, particularly high Brinell hardness indices (HB) of 95 and 115 were obtained for the supporting layer (2). The uniformity and the size of the grain are particularly advantageous because these insure uniform removal of surface atoms during sputtering.

This invention further provides a method for preparing a target suitable for physical coating processes, e.g., by sputtering. This method entails heating at a temperature of from about 450° to about 550° C. the roll-bonded composite plate described above in a conventional salt bath for less than about 30 minutes; cooling said heated roll-bonded composite aluminum plate; and curing said cooled plate at a temperature of from about 160° to about 180° C. for a period of time of from about 2 to about 16 hours. Alternatively, the cooled plate can be naturally aged. Cooling can be carried out, for example, by quenching in cold water. A target suitable for physical coating processes, such as cathodic sputtering and magnetron sputtering can be obtained from the composite aluminum plate described herein under this method.

The working examples set forth below are intended to illustrate the invention without limiting its scope.

EXAMPLE 1

A composite plate was prepared by roll-bonding two layers using a hot rolling mill 350 t milling force Achenbach (Buschhuetten, West Germany). One layer was 14 mm thick and consisted of a pure aluminum silicon alloy with 1% silicon (purity $\geq$ 99.999%; impurities $\leq$ 0.001%) melted on a pure aluminum basis (purity $\geq$ 99.999%; impurities $\leq$ 0.001%). A supporting layer was made from a hardenable AlMgSi alloy and was 5 mm thick. The composite plate so prepared was divided into sections A and B and then treated as follows:

TABLE 1

| TREATMENT CONDITIONS FOR PREPARING TARGET | | |
|---|---|---|
| Treatment | Solution Heat Treatment Time In Salt Bath | Solution Temperature |
| A | 20 min. | 530° C. |
| B | 5 min. | 490° C. |

The plates were subsequently quenched in cold water and artificially cured or aged for 16 hours at 160° C.

The measurement of the Brinell hardness (HB) of the supporting layer and of the grain size in the longitudinal direction of the cross section of the surface layer are described below in Table 2.

TABLE 2

| | PHYSICAL CHARACTERISTICS OF TARGET | | | | |
|---|---|---|---|---|---|
| Treatment | Grain Cross Section in Micrometers | Average Grain Diameter Micrometers | Elongation Ratio | HB Brinell Hardness* | Reference Figure |
| A | $2.37 \times 10^5 - 1.78 \times 10^6$ | 549–1,505 | 1 | 115 | 2 |
| B | $1.78 \times 10^4 - 7.50 \times 10^4$ | 151–309 | 1 | 95 | 3 |

*measured by DIN 50351 with load of 613 N and ball theta of 2.5 mm.

surface (1) layer.

The following measurements were obtained for the surface layer (1) by carrying out the examples set forth below; grain cross-section of from about $2.37 \times 10^5 - 1.78 \times 10^6$ $um^2$ to about $1.78 \times 10^4 - 7.5 \times 10^4$ $um^2$; average grain diameter of from about 549–1,505

It can be seen from the results in Table 2 that useful aluminum composite plates and targets, prepared pursuant to this invention, can be obtained with desirable globulitic structure and having an elongation ratio of 1. Such a target is useful to withstand bombardment heating in, for example, cathodic sputtering and magnetron sputtering.

EXAMPLE 2

In this example, the two targets obtained in Example 1 were subjected to cathodic sputtering. Cathodic sputtering was carried out by using a conventional sputtering technique.

The target exhibited good heat conductivity and mechanical stability during the course of the treatment.

EXAMPLE 3

In this example, the two targets obtained in Example 1 were subjected to magnetron sputtering. Magnetron sputtering was carried out by using a Balzers magnetron sputtering source type AR 125.

The target exhibited good heat conductivity and mechanical stability during the course of the treatment.

What is claimed is:

1. A coating target prepared by heating a roll bonded composite aluminum plate at a temperature of from about 450° C. to about 550° C. in a salt bath for less than about 30 minutes, said plate comprising:
   i) a surface layer consisting of pure aluminum or an aluminum alloy, and
   ii) a supporting layer comprising a hardenable aluminum alloy having a Brinell hardness index HB of at least about 50.
   quenching said heated aluminum plate; and
   aging said cooled plate at a temperature of from about 160° C. to about 180° C. for between about 2 to about 16 hours.

2. The target according to claim 1 wherein said surface layer has an average grain diameter of about 4 mm or less.

3. The target according to claim 2 wherein said average grain diameter is about 2 mm or less.

4. The target according to claim 3 wherein aluminum grains in the surface layer have an elongation ratio of about 4 or less.

5. The target according to claim 4 wherein said elongation ratio is about 2 or less.

* * * * *